United States Patent [19]

Kawano et al.

[11] Patent Number: 5,585,421

[45] Date of Patent: Dec. 17, 1996

[54] COMPOSITION DISPENSABLE AT HIGH SPEED FOR BONDING ELECTRIC PARTS TO PRINTED WIRING BOARDS

[75] Inventors: Takayuki Kawano, Kasukabe; Hiroaki Minamoto, Saitama-ken; Rihei Nagase, Tokyo, all of Japan

[73] Assignee: Somar Corporation, Japan

[21] Appl. No.: 413,866

[22] Filed: Mar. 29, 1995

[30] Foreign Application Priority Data

Mar. 31, 1994 [JP] Japan ................... 6-085968

[51] Int. Cl.$^6$ ............. C08L 63/00; C08L 77/00; C08K 3/34
[52] U.S. Cl. ............ 523/466; 523/443; 524/310; 525/423
[58] Field of Search ................ 523/443, 466; 524/310; 525/423

[56] References Cited

U.S. PATENT DOCUMENTS

| | | | |
|---|---|---|---|
| 4,383,060 | 5/1983 | Dearlove | 523/429 |
| 4,383,061 | 5/1983 | Neal, Jr. | 523/466 |
| 4,460,718 | 7/1984 | Tanaka | 523/443 |
| 4,555,532 | 11/1985 | Tanaka | 523/443 |
| 4,833,178 | 5/1989 | Schaefer | 523/466 |
| 5,192,816 | 3/1993 | Iizuka | 523/466 |

FOREIGN PATENT DOCUMENTS

| | | |
|---|---|---|
| 0240183 | 3/1987 | European Pat. Off. |
| 0459614 | 4/1991 | European Pat. Off. |
| 0620332 | 3/1994 | European Pat. Off. |
| 9208760 | 11/1991 | WIPO . |

OTHER PUBLICATIONS

Lee et al., "Handbook of Epoxy Resins", McGraw–Hill Book Co., New York, pp. 14/4–7 (Reissue 1982).

C. Orr, , "Size Measurement of Particles", Kirk–Othmer Encyl. of Chem. Tech., 21st ed., John Wiley & Sons, New York, vol. 21, pp. 107–131 (1983).

*Primary Examiner*—D. R. Wilson
*Attorney, Agent, or Firm*—Lorusso & Loud

[57] ABSTRACT

A liquid epoxy resin composition is disclosed which comprises a liquid epoxy resin, an amine curing agent, an inorganic filler such as calcined talc, and an organic rheology additive such as modified castor oil. The epoxy resin composition having not greater than 0.4 of an R-value defined by the following equation:

$$R=\eta_{10}/Sc$$

wherein $\eta_{10}$ is a viscosity in Pa.s of the composition at a rate of shear of 10 sec$^{-1}$ and Sc represents a Casson yielding point shows excellent adaptability to a high speed dispenser.

3 Claims, 1 Drawing Sheet

FIG. I(a)
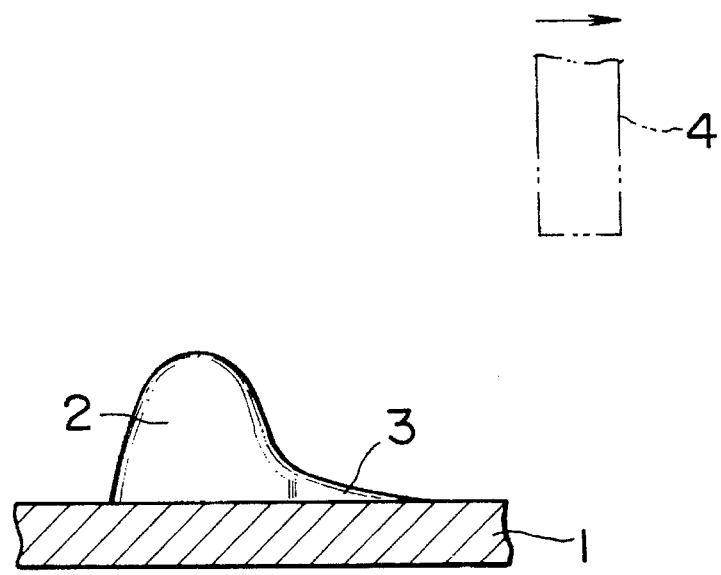
FIG. I(b)
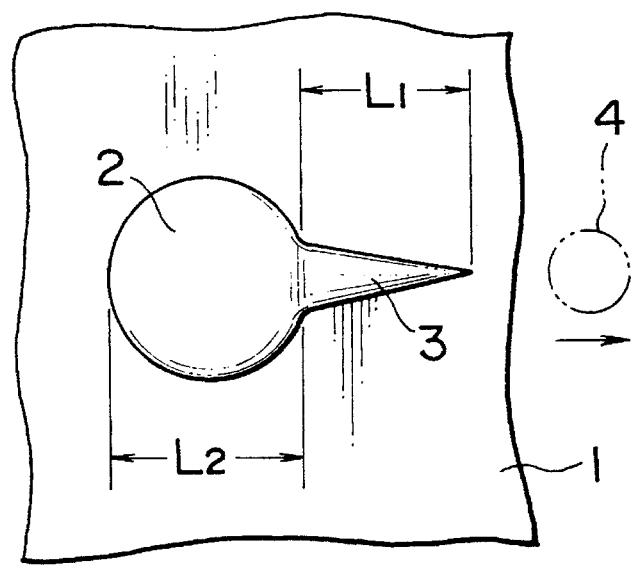

COMPOSITION DISPENSABLE AT HIGH SPEED FOR BONDING ELECTRIC PARTS TO PRINTED WIRING BOARDS

BACKGROUND OF THE INVENTION

This invention relates generally to an epoxy resin composition and, more specifically, to an improved epoxy resin composition suitable for bonding electric parts onto printed wiring boards using a dispenser.

It is known to use an epoxy resin adhesive composition for bonding electric parts such as IC elements to printed wiring boards. In this case, it is the general practice to apply the adhesive composition to the board by means of a dispenser.

One known epoxy resin composition suited for dispensation with a dispenser includes an epoxy resin, an amine-type curing agent, a thixotropic agent and hydrophilic silica (Japanese Published Unexamined Patent Application No. 4-33916). The known composition shows little change in viscosity with time. Further, the shape of a dot of the composition applied on the board almost remains unchanged during the course of curing. However, the known composition has been found to be ill-suited for used with a high speed dispenser operated with a tact time of, for example, below 0.15 second. In particular, when a series of dots of the adhesive composition are successively formed on a board at a high speed with a dispenser, a greater part of the dots thread in the direction parallel with the moving direction of the dispenser relative to the board. Namely, as shown in FIGS. 1(a) and 1(b), a dot 2 applied onto a board 1 threads to form a tail-like portion 3 along the movement of a dispensing nozzle 4 in the direction shown by the arrow relative to the board 1. When the length of the tail-like portion 3 exceeds 20% of the diameter of the dot 2, it is necessary to slow down the tact time of the dispenser.

SUMMARY OF THE INVENTION

It is, therefore, an object of the present invention to provide an epoxy resin composition which is suited for use with a high speed dispenser.

Another object of the present invention is to provide an epoxy resin composition of the above-mentioned type which shows good storage stability (long pot life) and which does not form a long tail when applied at a high speed by means of a dispenser.

In accomplishing the foregoing object, there is provided in accordance with the present invention a liquid epoxy resin composition comprising a liquid epoxy resin, an amine curing agent, an inorganic filler, and an organic rheology additive.

BRIEF DESCRIPTION OF THE DRAWINGS

Other objects, features and advantages of the present invention will become apparent from the detailed description of the preferred embodiments which follow, when considered in light of the accompanying drawings, in which:

FIG. 1(a) is a vertical sectional view showing a shape of a dot of an epoxy resin composition applied to a surface of a board with a dispenser; and FIG. 1(b) is a plan view of FIG. 1(a).

DETAILED DESCRIPTION OF THE PREFERRED EMBODIMENTS OF THE INVENTION

The liquid, epoxy resin composition according to the present invention contains an epoxy resin, a curing agent, an inorganic filler and an organic rheology additive.

The epoxy resin is a liquid epoxy resin having two or more epoxy groups in its molecule. Examples of suitable epoxy resins include diglycidyl ethers of bisphenol A, bisphenol F, bisphenol AD, brominated bisphenol A, phenol novolak resins, glycerin and polyalkylene oxides; glycidyl esters of carboxylic acids such as dimer acid and isophthalic acid; epoxidized polybutadiene obtained by reaction of polybutadiene with peracetic acid; urethane-modified diglycidyl ethers of bisphenol A; heterocyclic epoxy resins; and mixtures thereof. These epoxy resins may be used singly or as a mixture of two or more. The use of epoxy resins which are liquid at room temperature is preferred. But, it is possible to use crystalline or solid epoxy resins if they are able to be dissolved in the liquid epoxy resin used.

As the amine curing agent, conventional latent curing agents having two or more primary, secondary or tertilly amine groups, such as dicyandiamide, derivatives of dicyandiamide, imidazole compounds, organic acid hydrazides, amine-adducts, spiroacetal compounds, modified polyamides, modified polyamines and amine-urea adducts are suitably used.

Illustrative of suitable imidazole compounds are 2-heptadecylimidazole, 2-phenyl-4,5-dihydroxymethylimidazole, 2-phenyl-4-methyl-5-hydroxymethylimidazole, 2-phenyl-4-benzyl-5-hydroxymethylimidazole, 2,4-diamino-6-{2-methylimidazolyl-(1)}ethyl-5-triazine and an additional product of the triazine with isocyanuric acid. Illustrative of suitable hydrazides are succinohydrazide, adipohydrazide, isophthalohydrazide, o-oxybenzohydrazide and salicylohydrazide. Examples of amine adducts include AMICURE PN-23 (manufactured by Ajinomoto Co., Inc.) AMICURE MY-24 (manufactured by Ajinomoto Co., Inc.) and NOVACURE HX-3721 (manufactured by Asahi Kasei Kogyo K. K.). Examples of spiroacetal compounds include AMICURE ATU CARBAMATE 3 (manufactured by Ajinomoto Co., Inc.). Examples of modified polyamides include Hardner HT939 (manufactured by Japan Ciba Geigy Inc. and disclosed in U.S. Pat. No. 4,459,398, examples of modified polyamines include Hardner and examples of amine-urea adducts include Fujicure FXE-1000 (manufactured by Fuji Kasei K. K.). The amine curing agent is generally used in an amount of 3–60 parts by weight, preferably 5–40 parts by weight per 100 parts by weight of the epoxy resin.

Any known organic rheology additive may be used for the purpose of the present invention. Illustrative of suitable rheology additives are modified castor oil rheology additives and organic amide rheology additives. The modified castor oil additive having a melting point of 60°–140° C. is suitably used. The modified castor oil additive is a product obtained by hydrogenating castor oil and may be, for example, Thixcin-R manufactured by Rheox Intern. Inc. The modified amide rheology additives are products which are obtained by reacting a polycarboxylic acid, such as sebacic acid, dodecane dicarboxylic acid or dimer acid, with an active hydrogen-containing compound, such as 1,6-diaminohexane, 1,8-diaminooctane or 1,6-hexanediol, using, as a capping agent, a hydroxycarboxylic acid, such as ricinoleic acid or 12-hydroxystearic acid and which are disclosed in Japanese Published Unexamined Patent Application No. 63-145332. The rheology additive is generally used in an amount of 0.1–15 parts by weight, preferably 1–10 parts by weight per 100 parts by weight of the epoxy resin.

Any inorganic filler may be used for the purpose of the present invention. Illustrative of suitable inorganic fillers are silica, calcium carbonate, dolomite, calcium silicate, alumina, mica, talc and clay. The inorganic filler generally has an average particle diameter of 0.5–20 μm, preferably 1–10 μm. It is preferred that calcined talc be used as the inorganic filler for reasons of improved pot life and storage stability. The calcined talc is a product obtained by heating talc at a temperature sufficient to effect the dehydration thereof, preferably at 900°–1,200° C. The inorganic filler is generally used in an amount of 1–100 parts by weight, preferably 5–50 parts by weight per 100 parts by weight of the epoxy resin.

The liquid epoxy resin composition of the present invention may further contain various conventional additives such as a reactive diluent, a pigment, an antifoaming agent and a leveling agent. The reactive diluent is a compound which has at least one epoxy group and which is a low viscosity liquid at room temperature. Examples of suitable reactive diluents include phenyl glycidyl ether, polyethylene glycol diglycidyl ether, polypropylene glycol diglycidyl ether, methyl glycidyl ether, propyl glycidyl ether, pentaerythritol polyglycidyl ether, sorbitan polyglycidyl ether, n-butyl glycol glycidyl ether and 2-ethylhexyl glycidyl ether. The reactive diluent is used for decreasing the viscosity of the composition.

It is preferred that the liquid epoxy resin composition of the present invention have an R-value of not greater than 0.4 for reasons of improved adaptability to high speed dispensation. The R-value is a value obtained by the following equation:

$$R = \eta_{10}/Sc$$

wherein $\eta_{10}$ is a viscosity in Pa.s of the composition at a rate of shear of 10 sec$^{-1}$ and Sc represents a Casson yielding point which is determined according to the following equation:

$$S^{1/2} = (Sc)^{1/2} + (\mu_c \times D)^{1/2}$$

where S represents a shearing stress of the composition, Sc is as defined above, D is a rate of shear of the composition and $\mu_c$ represents a Casson viscosity of the composition. The R-value may be controlled by selecting the kind and particle size of the inorganic filler and the amount of the organic rheology additive.

The liquid epoxy resin composition of the present invention can be prepared in any known manner by, for example, using a milling device. The epoxy resin composition, when used as an adhesive for fixing electric parts on a printed wiring board, may be applied onto a surface of the board by a method using a high speed dispenser without forming undesirable threads or tails The following examples will further illustrate the present invention.

EXAMPLE

Epoxy resin composition Nos. 1–12 having the formulation shown in Table 1 were prepared. In Table 1, "Epoxy Resin", "Curing Agent B-1 through B-3", "Rheology Additive" and "Inorganic Filler D-1 through D-5" are as follows:

Epoxy Resin: Bisphenol A diglycidyl ether, Epikote 828, manufactured by Yuka-Shell Epoxy Inc.

Curing Agent
  B-1: Amine adduct curing agent, Amicure PN-23, manufactured by Ajinomoto Inc.
  B-2: Modified polyamide curing agent, Hardner HT939, manufactured by Ciba Geigy Inc.
  B-3: Modified aliphatic polyamine curing agent, ACR Hardner H-4070S, manufactured by ACR Inc.

Rheology Additive: Castor oil rheology additive, Thixcin-R, manufactured by Rheox Intern. Inc., melting point: 86° C.

Inorganic Filler
  D-1: Hydrophilic silica, Aerosil #300, manufactured by Nippon Aerosil Inc.
  D-2: Hydrophobic silica, Aerosil R202, manufactured by Nippon Aerosil Inc., silicone oil-treated silica
  D-3: Sintered talc, Enstac 24, manufactured by Asada Seifun K. K., average particle size: 3.0 µm, talc sintered at 1,100° C
  D-4: Talc, LMP-100, manufactured by Fuji-Talc Industry Co., Ltd., average particle size: 3.0 µm
  D-5: Silica, Imsil A108, manufactured by Tatsumori Inc.

Each of the epoxy resin compositions Nos. 1–12 thus obtained was measured for the R-value, adaptability to high speed dispensation and pot life in the manner described below. The results are shown in Table 1.

R Value

Using a cone plate rotational viscometer (EHD Rotational Viscometer manufactured by Tokimec Inc., cone diameter: 28 mm, cone angle: 3 degree), a relationship between the rate of shear D (sec$^{-1}$) and the shearing stress S (Pa) of a sample composition is measured at 25° C. at rotational speeds of the cone plate of 0.5, 1.0, 2.5, 5.0 and 10 rpm after 5 minutes from the commencement of the rotation. In the case of the above viscometer, the rates of shear D at rotational speeds of 0.5, 1.0, 2.5, 5.0 and 10 rpm are 1.0, 2.0, 5.0, 10 and 20 sec$^{-1}$, respectively. Then, from the relationship between D and S, Casson yielding point Sc is determined according to the following Casson equation:

$$S^{1/2} = (Sc)^{1/2} + (\mu_c \times D)^{1/2}$$

where S, Sc and D are as defined above and $\mu_c$ represents a Casson viscosity. Thus, the measured data are plotted on a coordinate system with $S^{1/2}$ and $D^{1/2}$ as the x and y axes, respectively. The Casson yielding point $Sc^{1/2}$ is determined by extrapolating the relationship between $S^{1/2}$ and $D^{1/2}$ into a state where $D^{1/2}$ is 0. From the viscosity $\eta_{10}$ and the Casson yielding point Sc thus obtained, the R value is calculated according to the equation:

$$R = \eta_{10}/Sc$$

Adaptability to High Speed Dispensation

A sample composition is charged in a dispenser and is dispensed at 28° C. with a shot time of 0.05 second and a tact time of 0.12 second through a dispenser nozzle having an inside diameter of 0.7 mm, so that 5,000 shots of the sample are continuously applied onto a substrate. The dispensing pressure is so controlled that each of the applied dots has a diameter of 1.4 mm. Then, the 5000 dots thus applied are checked for the formation of threads. When the length ($L_1$ in FIG. 1(b)) of the thread (designated as 3 in FIGS. 1(a) and 1(b)) of an applied dot (designated as 2 in FIGS. 1(a) and 1(b)) exceeds 20% of the diameter ($L_2$ in FIG. 1(b)) of the dot, then that dot is determined as being defective. The number of such defective dots are counted, from which the adaptability to high speed dispensation is evaluated. The evaluation is rated as follows:

A: excellent (the number of defective dots is not greater than 50)

B: fair (the number of defective dots is over 50 but is less than 100)

C: no good (the number of defective dots is 100 or more)

Pot Life

The viscosity in Pa.s of a sample composition just prepared is measured at 25° C. with the rotational viscometer as used for the measurement of R values. The rotational speed of the cone plate is 0.5 rpm. The sample is stored at 40° C. for 3 weeks and thereafter measured for the viscosity thereof again. The viscosity changing rate V is calculated according to the following equation:

$$V = A/B \times 100 \ (\%)$$

wherein A represents the viscosity after 3 weeks storage and B represents the initial viscosity. The pot life of the sample is rated as follows:

A: excellent ($90 < V \leq 110$)
B: fair ($70 < V \leq 90$ or $110 < V \leq 130$)
C: no good ($V \leq 70$ or $130 < V$)

TABLE 1

| | Composition No. | | | | | |
|---|---|---|---|---|---|---|
| | 1 | 2 | 3 | 4 | 5 | 6 |
| Epoxy Resin | 100 | 100 | 100 | 100 | 100 | 100 |
| Curing Agent B-1 | 10 | 10 | 10 | 25 | 10 | 10 |
| Curing Agent B-2 | 40 | 40 | 40 | — | — | 40 |
| Curing Agent B-3 | — | — | — | — | 40 | — |
| Rheology Additive | 1 | 5 | 10 | 5 | 5 | 5 |
| Filler D-1 | — | — | — | — | — | — |
| Filler D-2 | — | — | — | — | — | — |
| Filler D-3 | 30 | 30 | 30 | 30 | 30 | 5 |
| Filler D-4 | — | — | — | — | — | — |
| Filler D-5 | — | — | — | — | — | — |
| R-Value | 0.40 | 0.33 | 0.26 | 0.31 | 0.35 | 0.26 |
| Adaptability | A | A | A | A | A | A |
| Pot Life | A | A | A | A | A | A |
| | 7 | 8 | 9 | 10 | 11 | 12 |
| Epoxy Resin | 100 | 100 | 100 | 100 | 100 | 100 |
| Curing Agent B-1 | 10 | 10 | 10 | 10 | 10 | 10 |
| Curing Agent B-2 | 40 | 40 | 40 | 40 | 40 | 40 |
| Curing Agent B-3 | — | — | — | — | — | — |
| Rheology Additive | 5 | 5 | 5 | 5 | 5 | — |
| Filler D-1 | — | 5 | — | — | — | — |
| Filler D-2 | — | — | 5 | — | — | 5 |
| Filler D-3 | 50 | 30 | 30 | — | — | 30 |
| Filler D-4 | — | — | — | 30 | — | — |
| Filler D-5 | — | — | — | — | 30 | — |
| R-Value | 0.33 | 0.37 | 0.40 | 0.33 | 0.55 | 0.66 |
| Adaptability | A | A | A | A | B | C |
| Pot Life | A | A | A | C | A | A |

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A liquid epoxy resin composition comprising:

3–60 parts by weight of an amine curing agent;

1–100 parts by weight of a calcined talc;

0.1–15 parts by weight of an organic rheology additive;

100 parts by weight of a liquid epoxy resin curable by said amine curing agent, wherein said composition has an R-value of not greater than 0.4, wherein said R-value is defined by the following equation:

$$R = \eta_{10}/Sc$$

wherein $\eta_{10}$ is viscosity in Pa.s of the composition at 25° C. and at a rate of shear of 10 sec$^{-1}$ and Sc represents a Casson yielding point determined according to the following equation:

$$S^{1/2} = (Sc)^{1/2} + (\mu_c \times D)^{1/2}$$

wherein S represents shear stress in Pa of the composition at 25° C., Sc is as defined above, D is the rate of shear in sec$^{-1}$ of the composition at 25° C. and $\mu_c$ represents Casson viscosity of the composition, and wherein said rheology additive is selected from the group consisting of hydrogenated castor oil and organic polyamide rheology additives.

2. A composition according to claim 1, wherein said hydrogenated castor oil additive has a melting point of 60°–140° C.

3. A composition according to claim 1, wherein said calcined talc is prepared by heating talc at 900°–1,200° C. for dehydration.

* * * * *

UNITED STATES PATENT AND TRADEMARK OFFICE
CERTIFICATE OF CORRECTION

PATENT NO. : 5,585,421
DATED : December 17, 1996
INVENTOR(S) : KAWANO et al

It is certified that error appears in the above-indentified patent and that said Letters Patent is hereby corrected as shown below:

Col. 2, line 36, delete "examples of modified"; and line 37, delete "polyamides include Hardner".

Signed and Sealed this

Twenty-fifth Day of November, 1997

Attest:

BRUCE LEHMAN

*Attesting Officer*  *Commissioner of Patents and Trademarks*